US012404582B2

(12) United States Patent
Ishizaka et al.

(10) Patent No.: US 12,404,582 B2

(45) Date of Patent: Sep. 2, 2025

(54) METHOD AND APPARATUS FOR EMBEDDING RUTHENIUM IN RECESS FORMED ON SUBSTRATE SURFACE

(71) Applicant: TOKYO ELECTRON LIMITED, Tokyo (JP)

(72) Inventors: Tadahiro Ishizaka, Nirasaki (JP); Mikio Suzuki, Nirasaki (JP); Toshio Hasegawa, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 39 days.

(21) Appl. No.: 18/292,262

(22) PCT Filed: Jul. 15, 2022

(86) PCT No.: PCT/JP2022/027910

§ 371 (c)(1),
(2) Date: Jan. 25, 2024

(87) PCT Pub. No.: WO2023/008239

PCT Pub. Date: Feb. 2, 2023

(65) Prior Publication Data

US 2024/0360547 A1 Oct. 31, 2024

(30) Foreign Application Priority Data

Jul. 27, 2021 (JP) ................................ 2021-122649

(51) Int. Cl.
*C23C 16/04* (2006.01)
*C23C 16/16* (2006.01)
(Continued)

(52) U.S. Cl.
CPC ............ *C23C 16/045* (2013.01); *C23C 16/16* (2013.01); *C23C 16/458* (2013.01); *C23C 16/52* (2013.01)

(58) Field of Classification Search
CPC ..... C23C 16/045; C23C 16/16; C23C 16/458; C23C 16/52; C23C 16/18; C23C 16/4481;
(Continued)

(56) References Cited

U.S. PATENT DOCUMENTS

2001/0006838 A1* 7/2001 Won ...................... H10D 1/692 427/79
2001/0026963 A1* 10/2001 Itatani .................... H10D 1/696 438/149

(Continued)

FOREIGN PATENT DOCUMENTS

JP 2002-217387 A 8/2002
JP 2018-147949 A 9/2018

(Continued)

*Primary Examiner* — Michael G Miller

(74) *Attorney, Agent, or Firm* — Nath, Goldberg & Meyer; Jerald L. Meyer; Tanya E. Harkins

(57) ABSTRACT

A method for embedding ruthenium in a recess formed on a surface of a substrate includes: forming a ruthenium layer in a region including a bottom portion of the recess by supplying a gas including, as a ruthenium precursor, a ruthenium compound that does not contain oxygen and carbon atoms to the substrate having a metal exposed on a bottom surface of the recess; and subsequently embedding ruthenium in the recess so as to cover the ruthenium layer by supplying a gas including, as a ruthenium precursor, $Ru_3(CO)_{12}$ to the substrate.

20 Claims, 10 Drawing Sheets

651 V62 M4 V61 6 65 631 V42 M3 63 641 V52 64 2B V41 V51 43 61 S2 62 GV3 22 23 24 25

(51) Int. Cl.
*C23C 16/458* (2006.01)
*C23C 16/52* (2006.01)

(58) Field of Classification Search
CPC ....... C23C 16/06; C23C 16/54; H01L 21/283; H01L 21/285; H01L 21/28556; H01L 21/28562; H01L 21/76843; H01L 21/76877; H01L 21/67184; H01L 21/67207
See application file for complete search history.

(56) References Cited

U.S. PATENT DOCUMENTS

| | | | | |
|---|---|---|---|---|
| 2003/0124252 | A1* | 7/2003 | Park | C23C 16/45557 427/255.28 |
| 2003/0134511 | A1* | 7/2003 | Kim | C23C 16/18 438/674 |
| 2018/0254181 | A1* | 9/2018 | Ishizaka | H01L 21/76883 |
| 2018/0347041 | A1* | 12/2018 | Kim | C23C 16/45534 |
| 2019/0252511 | A1 | 8/2019 | Clendenning et al. | |

FOREIGN PATENT DOCUMENTS

| | | | |
|---|---|---|---|
| JP | 2020-47864 | A | 3/2020 |
| KR | 10-2017-0141135 | A | 12/2017 |
| KR | 10-2020-0033742 | A | 3/2020 |
| KR | 10-2021-0007860 | A | 1/2021 |

* cited by examiner 2A
5
551
V32
M2
V31
55
43
54
4
41
42
21
25
24
23
3
10
32
31
211
20
GV2
V22
541
V21
S1
52
53
V11
51
M1
V12
531

2B
22
25
24
23
43
64
6
65
GV3
V52
641
V51
S2
62
V61
63
V41
61
M4
M3
V62
V42
651
631

METHOD AND APPARATUS FOR EMBEDDING RUTHENIUM IN RECESS FORMED ON SUBSTRATE SURFACE

This is a National Phase Application filed under 35 U.S.C. 371 as a national stage of PCT/JP2022/027910, filed Jul. 15, 2022, an application claiming the benefit of Japanese Patent Application No. 2021-122649, filed Jul. 27, 2021, the content of each of which is hereby incorporated by reference in its entirety.

TECHNICAL FIELD

The present disclosure relates to a method and an apparatus for embedding ruthenium in a recess formed on a substrate surface.

BACKGROUND

In a manufacturing process of semiconductor devices, there are cases where a metal film is formed on a semiconductor wafer, which serves as a substrate for manufacturing semiconductor devices, and the metal film is a ruthenium film. In Patent Documents 1 and 2, a process of embedding ruthenium in a recess formed on the wafer is disclosed.

PRIOR ART DOCUMENTS

Patent Documents

Patent Document 1: Japanese Laid-open Publication No. 2018-147949

Patent Document 2: Japanese Laid-open Publication No. 2020-047864

The present disclosure provides a technique capable of implementing embedding of ruthenium in a recess formed on a substrate surface while preventing an increase in resistance.

SUMMARY

According to one embodiment of the present disclosure, a method for embedding ruthenium in a recess formed on a surface of a substrate includes: forming a ruthenium layer in a region including a bottom portion of the recess by supplying a gas including, as a ruthenium precursor, a ruthenium compound that does not contain oxygen and carbon atoms to the substrate having a metal exposed on a bottom surface of the recess; and subsequently embedding ruthenium in the recess so as to cover the ruthenium layer by supplying a gas including, as a ruthenium precursor, $Ru_3(CO)_{12}$ to the substrate.

According to the present disclosure, it is possible to implement embedding of ruthenium into a recess formed on a substrate surface while preventing an increase in resistance.

DETAILED DESCRIPTION

In a manufacturing process of semiconductor devices, there are steps of forming a recess on an insulating film by etching, and then embedding a wiring metal into the recess. With the miniaturization of semiconductor devices, ruthenium, which is a low-resistance material, has gained attention for use as an embedding metal. The present disclosure relates to a process of embedding ruthenium in a recess formed on a surface of a semiconductor wafer (hereinafter referred to as "wafer"), which serves as a substrate.

<Film Forming Apparatus>

Figure 1:
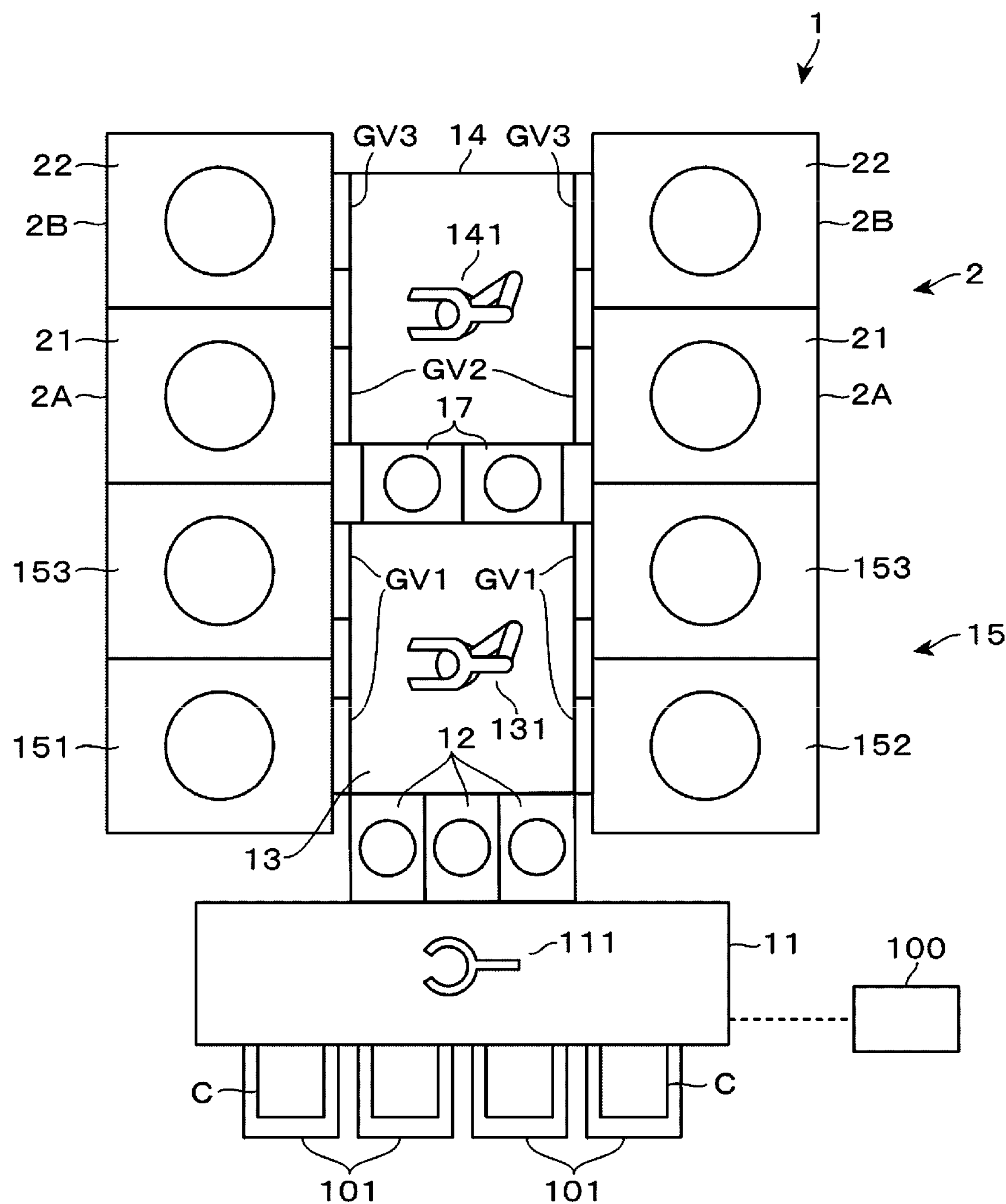
FIG. 1 is a schematic plan view illustrating one embodiment of an apparatus for embedding ruthenium according to the present disclosure.
Figure 2:
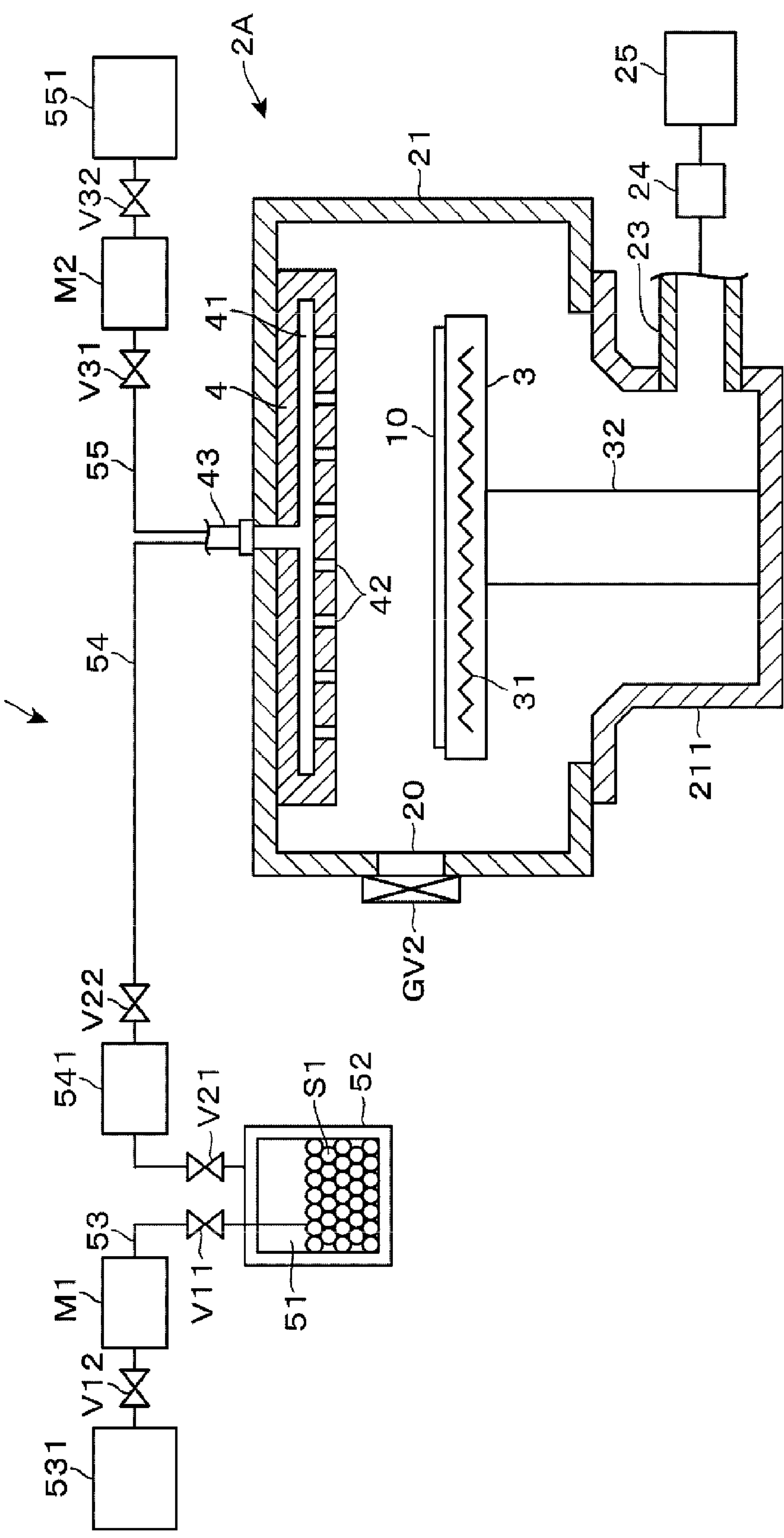
FIG. 2 is a longitudinal cross-sectional view illustrating an example of a first film formation processor provided in the above apparatus.

Hereinafter, one embodiment of an apparatus for embedding ruthenium (Ru) into a recess formed on a wafer surface (hereinafter referred to as "film forming apparatus") will be described with reference to FIGS. 1 and 2. FIG. 1 is a schematic plan view illustrating a configuration example of a film forming apparatus 1. This film forming apparatus 1 includes an atmospheric transfer chamber 11, a load lock chamber 12, first and second substrate transfer chambers 13 and 14, a plurality of preprocessors 15, and a plurality of Ru film formers 2.

The first substrate transfer chamber 13 and the second substrate transfer chamber 14 each have a rectangular shape in a plan view, and are connected to each other via two delivery sections 17, for example. Interiors of the first and second substrate transfer chambers 13 and 14 and the delivery sections 17 are set to a vacuum pressure atmosphere, and the pressures of the interiors of the first and second substrate transfer chambers 13 and 14 and the delivery sections 17 are made to be equal. The delivery section 17 is configured to deliver a wafer between the delivery section 17 and a first transfer mechanism 131 provided in the first substrate transfer chamber 13 or between the delivery section 17 and a second transfer mechanism 141 provided in the second substrate transfer chamber 14.

It is assumed that the direction in which these substrate transfer chambers 13 and 14 are arranged is the front-back direction, the first substrate transfer chamber 13 is at the front side, and the second vacuum transfer chamber 14 is at the rear side. The atmospheric transfer chamber 11, which is set to an atmospheric pressure atmosphere, is connected to the front side of the first substrate transfer chamber 13 via, for example, three load lock chambers 12. Wafer transfer openings and gate valves that open and close these transfer openings are provided respectively, between the first and second substrate transfer chambers 13 and 14 and the delivery sections 17, between the load lock chambers 12 and the first substrate transfer chamber 13, and between the load lock chambers 12 and the atmospheric transfer chamber 11, but these are omitted in the illustration.

Load ports 101 (e.g., four load ports 101) are connected to the atmospheric transfer chamber 11, and a carrier C accommodating multiple sheets of wafers 10 is mounted on each load port 101. An atmospheric transfer mechanism 111 is provided in the atmospheric transfer chamber 11 and is capable of transferring the wafer 10 between the carriers C connected to the atmospheric transfer chamber 11 and the load lock chambers 12.

When viewed from the front side, for example, two preprocessors 15 are connected to each of two walls (left wall and right wall) of the first substrate transfer chamber 13, respectively. The first transfer mechanism 131 provided in the first substrate transfer chamber 13 is then configured to transfer the wafer 10 between these four preprocessors 15, the delivery sections 17, and the load lock chambers 12. In FIG. 1, reference symbol GV1 denotes a gate valve.

In this example, the preprocessors 15 include an etching processor 151 that performs a chemical oxide removal (COR) process, a heating processor 152 that performs a post heat treatment (PHT) process, and a Ti film formation processor 153 that performs a film formation process for a titanium (Ti) film that becomes a contact layer provided in the silicon wafer at the underlayer side. The COR process, PHT process, and Ti film formation process correspond to preprocessing performed before embedding ruthenium into the recess on the wafer surface. The COR process and PHT process serve as pre-clean processing to remove a native oxide film ($SiO_x$) on the silicon wafer surface, which is formed on an inner surface of the recess.

The etching processor 151 is configured to use, for example, a hydrogen fluoride (HF) gas and an ammonia ($NH_3$) gas and to perform an etching process (COR process) on the native oxide film. Further, the heating processor 152 is configured to perform a PHT process that sublimates and removes a reaction product generated during the COR process by heating the wafer 10. This effectively removes the native oxide film. The Ti film formation processor 153 is configured to introduce a film forming gas for forming a Ti film into a processing container, thus forming a Ti film by a chemical vapor deposition (CVD) method.

When viewed from the front side, for example, two sets of Ru film formers 2 are connected, respectively, to two walls (left and right walls) of the second substrate transfer chamber 14. The second transfer mechanism 141 is then configured to transfer the wafer 10 between these four Ru film formers 2 and the delivery sections 17. In FIG. 1, reference symbols GV2 and GV3 denote gate valves, respectively. In this example, the second substrate transfer chamber 14 corresponds to a substrate transfer chamber of the present disclosure, and the second transfer mechanism 141 corresponds to a transfer mechanism of the present disclosure.

Each set of the Ru film formers 2 includes, for example, a first film formation processor 2A that forms a first ruthenium film (first Ru film) and a second film formation processor 2B that forms a second ruthenium film (second Ru film). The first Ru film is a thin film of ruthenium that is formed in a region, including a bottom portion of the recess on the wafer surface, using a gas containing, as a ruthenium precursor, a ruthenium compound that does not contain oxygen and carbon atoms. Further, the second Ru film is a ruthenium film that is embedded in the recess to cover the ruthenium layer (first Ru film) using a gas containing, as a ruthenium precursor, $Ru_3(CO)_{12}$.

<First Film Formation Processor>

Next, a configuration example of the first film formation processor 2A will be described with reference to FIG. 2. The first film formation processor 2A includes a first processing container 21, and a lower portion of the first processing container 21 is configured as an exhaust chamber 211. A sidewall of the first processing container 21 includes a transfer opening 20 connected to the second substrate transfer chamber 14 for loading and unloading the wafer 10 between the first processing container 21 and the second substrate transfer chamber 14. The transfer opening 20 is configured to be opened and closed by the gate valve GV2. The exhaust chamber 211 is connected to a vacuum exhaust mechanism 25 via an exhaust pipe 23 provided with a pressure adjuster 24.

A susceptor 3 that horizontally supports the wafer 10 is provided inside the first processing container 21 in a state in which the susceptor 3 is supported by a support column 32 from a bottom surface of the susceptor 3. The susceptor 3 includes a heater 31 and is configured to heat the wafer 10 to a preset temperature.

A showerhead 4 is arranged on a ceiling portion of the first processing container 21 so as to face the wafer 10 mounted on the susceptor 3. The showerhead 4 has a gas diffusion space 41, and gas outlets 42 are formed and dispersed on a lower surface of the showerhead 4.

The first film formation processor 2A includes a gas supply mechanism 5 including a first gas supplier. The first gas supplier is configured to supply a gas containing a ruthenium compound that does not contain oxygen atom and carbon atom, for example, $Ru(PF_3)_4H_2$, to the first processing container 21. The gas supply mechanism 5 of this example includes a precursor container 51 that accommodates a film forming precursor S1, and is configured such that the film forming precursor S1 inside the precursor container 51 is heated by a heater 52 provided on a sidewall of the precursor container 51. The solid-phase $Ru(PF_3)_4H_2$ as the film forming precursor S1 of the first Ru film is accommodated in the precursor container 51.

One end of a supply pipe 53 for a carrier gas is connected to the precursor container 51 so as to be inserted into the film forming precursor S1. The other end of that supply pipe 53 is connected to a carrier gas source 531 via a valve V11, a mass flow controller M1, and a valve V12 in this order from the downstream side. The carrier gas may be an inert gas such as argon (Ar) gas or nitrogen ($N_2$) gas. Further, an upper end surface of the precursor container 51 is connected to a gas inlet 43 of the showerhead 4 via a gas supply pipe 54, which has a valve V21, a flow meter 541, and a valve V22 in this order from the precursor container 51 side. The precursor container 51, the carrier gas source 531, the supply pipe 53 for the carrier gas, the gas supply pipe 54, and others constitute the first gas supplier of this example.

Further, the gas inlet 43 of the showerhead 4 is connected to a reaction gas source 551 via a gas supply pipe 55, which has a valve V31, a mass flow controller M2, and a valve V32 in this order from the downstream side. In this example, a reducing gas such as a hydrogen ($H_2$) gas is used as a reaction gas. Further, the reaction gas may also be a $NH_3$ gas, $H_2$ plasma, $NH_3$ plasma, monomethylhydrazine (MMH), hydrazine ($N_2H_4$), etc., in addition to the $H_2$ gas.

<Second Film Formation Processor>

Next, a configuration example of the second film formation processor 2B will be described with reference to FIG. 3. The second film formation processor 2B includes a second processing container 22. A sidewall of the second processing container 22 includes a transfer opening (not illustrated) connected to the second substrate transfer chamber 14 for loading and unloading the wafer 10 between the second processing container 22 and the second substrate transfer chamber 14. The transfer opening is configured to be able to be opened and closed by the gate valve GV3. In this example, other components inside the second processing container 22 have the same configuration as those inside the first processing container 21 as previously described above, and therefore, the description and illustration thereof are omitted. In addition, when referring to the components provided inside the second processing container 22 in the following description, there may be cases where reference numerals given to the components inside the first processing container 21 illustrated in FIG. 2 are also used.

The second film formation processor 2B includes a gas supply mechanism 6 including a second gas supplier. The second gas supplier is configured to supply, for example, a gas containing $Ru_3(CO)_{12}$ and a CO gas to the second processing container 22.

The gas supply mechanism 6 in this example includes a precursor container 61 that accommodates a film forming precursor S2 and is configured to be heated by a heater 62 provided on a sidewall thereof. The solid-phase $Ru_3(CO)_{12}$ as the film forming precursor S2 for the second Ru film is accommodated in the precursor container 61.

One end of a supply pipe 63 for a carrier gas is connected to the precursor container 61 so as to be inserted into the film forming precursor S2. The other end of that supply pipe 63 is connected to a carrier gas source such as a CO gas source 651 via a valve V41, a mass flow controller M3, and a valve V42 in this order from the downstream side. However, the carrier gas may be an inert gas such as Ar gas or $N_2$ gas, instead of a CO gas.

An upper end surface of the precursor container 61 is connected to the gas inlet 43 of the showerhead 4 via a gas supply pipe 64, which has a valve V51, a flow meter 641, and a valve V52 in this order from the precursor container 61 side. Further, the gas supply pipe 64 is connected, at a position between the valve V52 and the gas inlet 43, to a reaction adjustment gas source such as a CO gas source 651 via a gas supply pipe 65, which has a valve V61, a mass flow controller M4, and a valve V62 in this order from the downstream side. The reaction adjustment gas may be a $N_2$ gas, $H_2$ gas, Ar gas, or the like, in addition to a CO gas.

Figure 3:
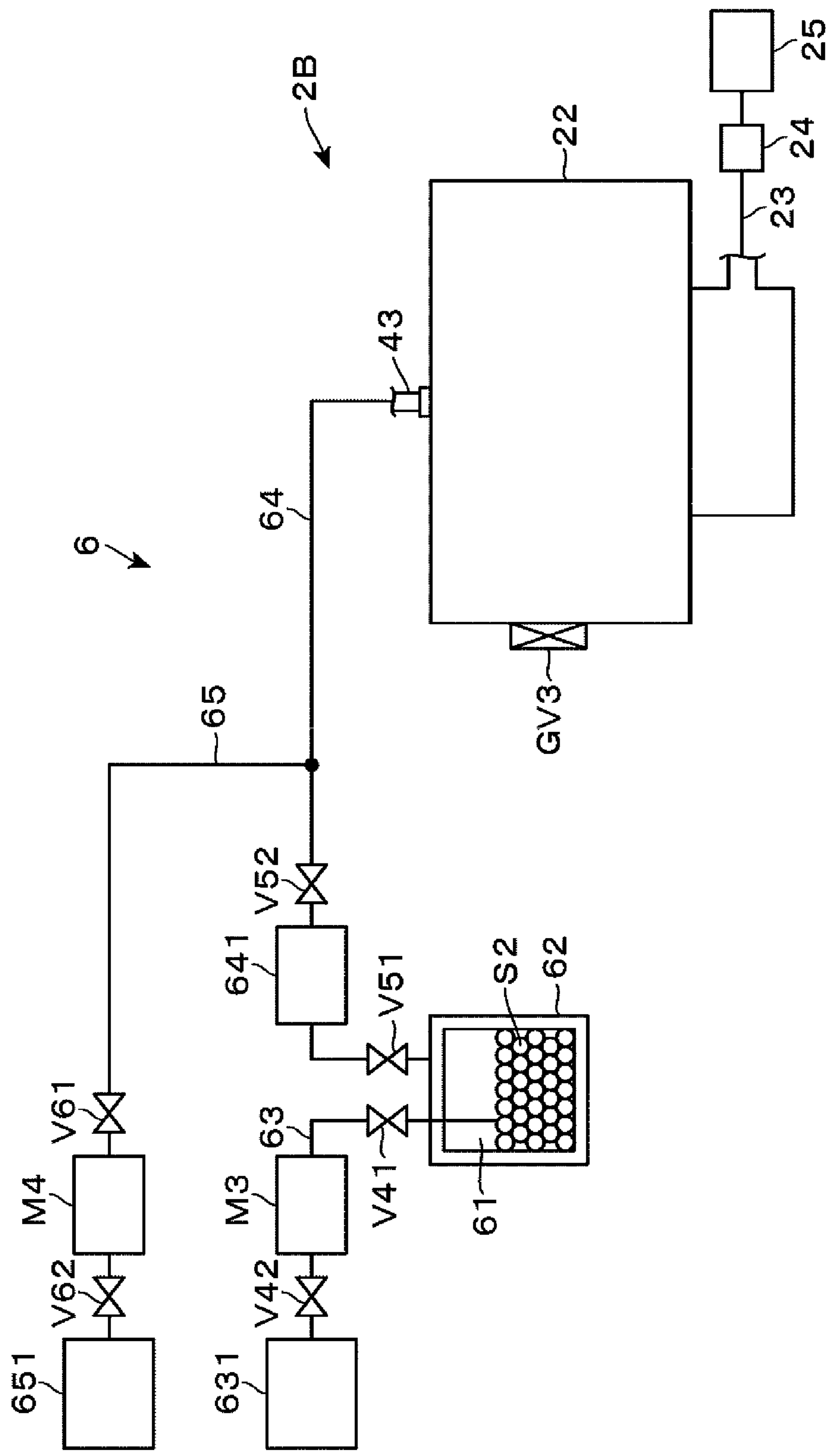
FIG. 3 is a longitudinal cross-sectional view illustrating an example of a second film formation processor provided in the above apparatus.

In the example illustrated in FIG. 3, the precursor container 61 of $Ru_3(CO)_{12}$, the carrier gas source 631, the supply pipe 63 of the carrier gas, the gas supply pipe 64, the CO gas source 651 for the reaction adjustment, the gas supply pipe 65, and others constitute the second gas supplier of this example.

<Controller>

The film forming apparatus 1 includes a controller 100 that controls the operation of each part that constitutes the film forming apparatus 1, such as various processes in the preprocessors 15 and the Ru film formers 2 and wafer transfer. This controller 100 is formed of, for example, a computer having a CPU and a storage, although not illustrated. The storage stores a program containing a group of steps (commands) related to the control required to form the ruthenium layer (first Ru film) and the embedding ruthenium (second Ru film) as will be described later. This program is, for example, stored in a storage medium such as a hard disk, compact disk, magneto optical disk, memory card, or non-volatile memory, and is installed from the storage medium to the computer.

<Surface Structure of Wafer>

Figure 4A:
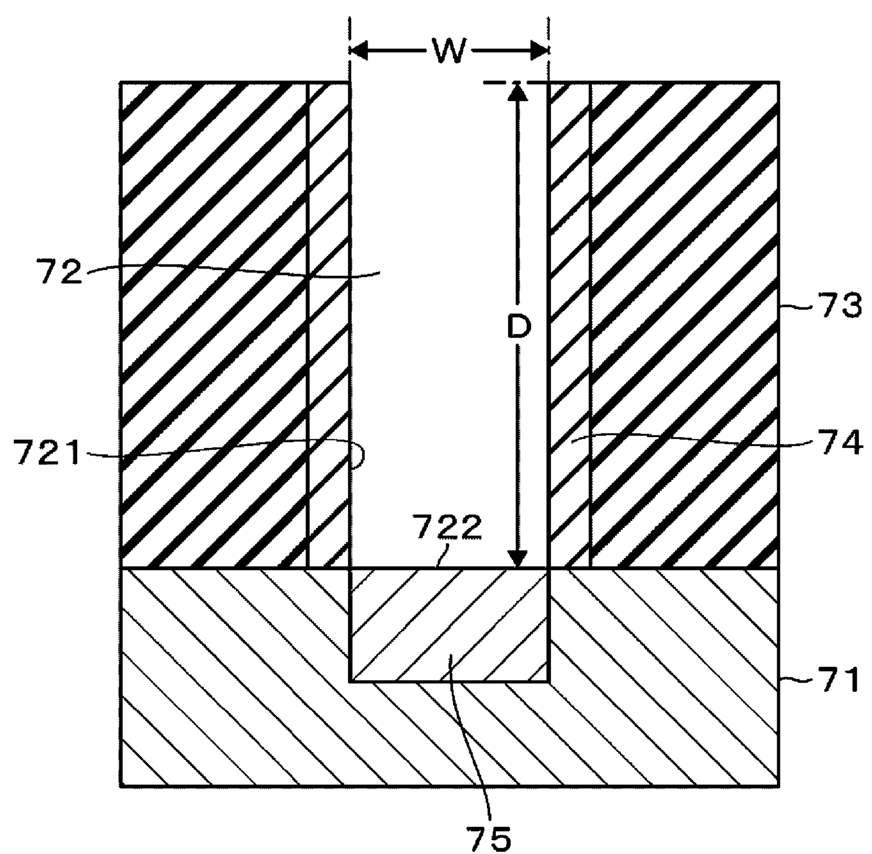
FIG. 4A is a first longitudinal cross-sectional view of a wafer surface related to a first embodiment step of a method for embedding ruthenium according to the present disclosure.

Here, an example of the surface structure of the wafer, which is a processing target for embedding of ruthenium, will be described with reference to FIG. 4A. An insulating film, such as a silicon oxide film (SiO film) 73, having a recess 72 is formed on a surface of a silicon wafer 71 serving as a substrate. A silicon nitride layer (SiN layer) 74 is formed on a sidewall portion 721 of this recess 72 so as to cover the SiO film 73. Further, for example, a surface of a titanium silicide layer (TiSi layer) 75, which is a metal layer containing titanium (Ti) and silicon (Si), is exposed at a bottom surface 722 of the recess 72. The TiSi layer 75 functions as a contact layer to establish conduction with the silicon wafer 71.

As an example of the dimensions of the recess 72, a width W is formed within a range of 5 nm to 20 nm, a depth D is formed within a range of 50 nm to 200 nm, and an aspect ratio (depth D/width W) is within a range of 2.5 to 40.

This surface structure of the wafer is formed as follows, for example. First, after forming the SiO film 73 on the surface of the silicon wafer 71, the recess 72 is formed by etching, and then the SiN layer 74 is formed to cover an inner surface of the recess 72. Subsequently, the bottom surface 722 of the recess 72 is removed by anisotropic etching to form a region for TiSi layer. After this, the wafer is transferred to the film forming apparatus 1 to form a Ti film, resulting in the formation of the TiSi layer 75.

First Embodiment

Next, a first embodiment of a method for embedding ruthenium in the recess 72 formed on the wafer surface will be described along with the operations of the film forming apparatus 1.

In the film forming apparatus 1, first, the wafer 10 accommodated in the carrier C is taken out by the atmospheric transfer mechanism 111 and is transferred to the load lock chamber 12 in an atmospheric pressure atmosphere. The load lock chamber 12 is then adjusted to a vacuum pressure atmosphere. Next, the wafer 10 inside the load lock chamber 12 is sequentially transferred to the etching processor 151 and the heating processor 152 by the first transfer mechanism 131, and is subjected to pre-clean processing previously described above to remove a native oxide film formed on the inner surface of the recess 72.

Subsequently, the wafer 10 is transferred to the Ti film formation processor 153 by the first transfer mechanism 131, and is subjected to formation of a Ti film on a region for TiSi layer. Once the Ti film has been formed, the TiSi layer 75 is formed by diffusing Si of the silicon wafer 71 into the Ti film. As a result, the surface of the TiSi layer 75 is exposed at the bottom surface 722 of the recess 72. The wafer 10, which has undergone these COR process, PHT process, and Ti film formation process, has the structure illustrated in FIG. 4A, and ruthenium is embedded in the wafer 10.

<Formation of Ruthenium Layer (First Ru Film)>

Subsequently, the wafer 10 is transferred to the first film formation processor 2A via the first transfer mechanism 131, the delivery sections 17, and the second transfer mechanism 141. The first film formation processor 2A performs a process of forming a ruthenium layer in a region including the bottom portion of the recess 72.

Specifically, the wafer 10 is loaded into the first processing container 21 and is mounted on the susceptor 3. The wafer 10 is then heated, and the interior of the first processing container 21 is evacuated. As is clear from an evaluation test to be described later, the film formation rate of the first Ru film at the same film formation temperature varies depending on the type of reducing gas.

At this time, $Ru(PF_3)_4H_2$ is heated by the heater 52 in the precursor container 51. A carrier gas is supplied to this precursor container 51, causing $Ru(PF_3)_4H_2$ vaporized by heating to be picked up and supplied to the first processing container 21 as a ruthenium precursor.

Figure 4B:
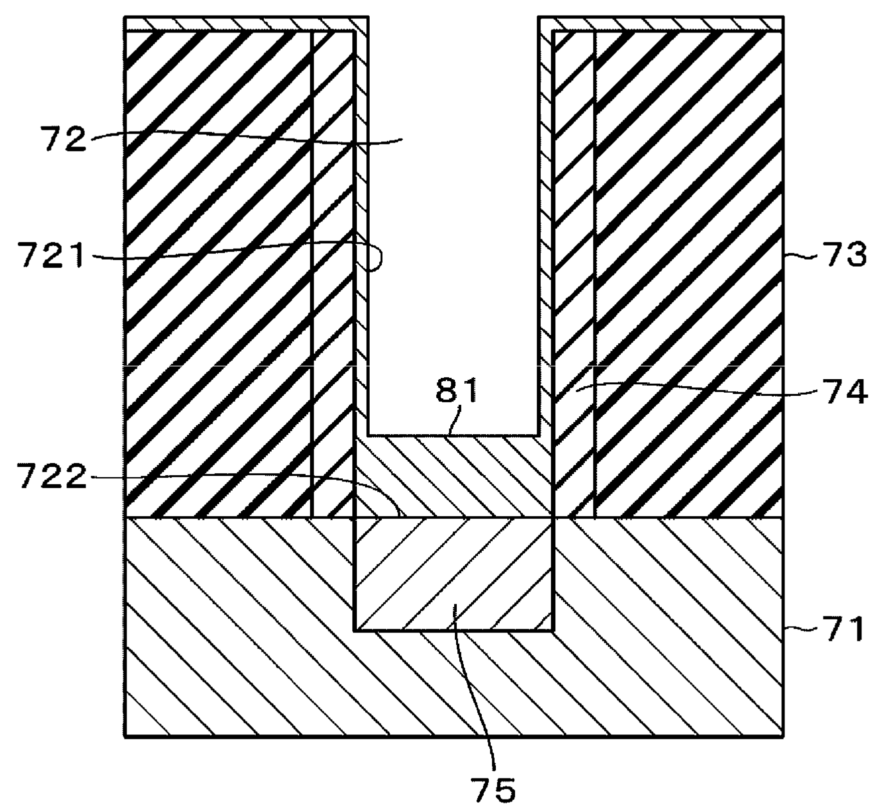
FIG. 4B is a second longitudinal cross-sectional view of the wafer surface.

Further, a $H_2$ gas serving as a reducing gas is supplied to the first processing container 21, thus forming a first Ru film 81, which is a ruthenium layer, in a region including the bottom portion of the recess 72 by CVD using the $H_2$ gas and a $Ru(PF_3)_4H_2$ gas (FIG. 4B). In this film formation process, $Ru(PF_3)_4H_2$ adsorbed onto the surface of the wafer 10 is reduced with the $H_2$ gas, resulting in the formation of a ruthenium film.

In the first embodiment, the ruthenium film (first Ru film 81) is formed such that the thickness of the ruthenium film is greater on the bottom surface 722 of the recess 72 where the TiSi layer 75 is exposed than on the sidewall portion 721 of the recess 72 covered with the SiN layer 74. Therefore, in this example, the first Ru film 81 is formed under a condition where the film formation rate is greater on the bottom surface 722 side of the recess 72 than on the SiN layer 74 side (sidewall portion side). This condition may be realized by adjusting factors such as the heating temperature of the wafer 10, the internal pressure of the processing container 21, and the supply ratio of the ruthenium precursor to the reducing gas. This condition may be specified, for example, through preliminary experiments. In addition, the inventors have confirmed that the above-described configuration of the Ru film is obtained when using $Ru(PF_3)_4H_2$ for film formation.

In this way, the first Ru film 81 is formed so as to be thicker on the bottom portion than on the sidewall portion 721 inside the recess 72. In this example, the thickness of the first Ru film 81 formed on the bottom portion of the recess 72 is within a range of 1 nm to 5 nm, and is, for example, 2 nm. In addition, the bottom portion of the recess 72 refers to a region including the bottom surface 722, which will be described in the second embodiment to be described later. Further, the thickness of the first Ru film 81 formed on the sidewall portion 721 is sufficient to allow the subsequent embedding of ruthenium (formation of a second Ru film 82 into the recess 72) without blocking the recess 72. This film thickness varies depending on the width W and the aspect ratio of the recess 72.

Figure 4C:
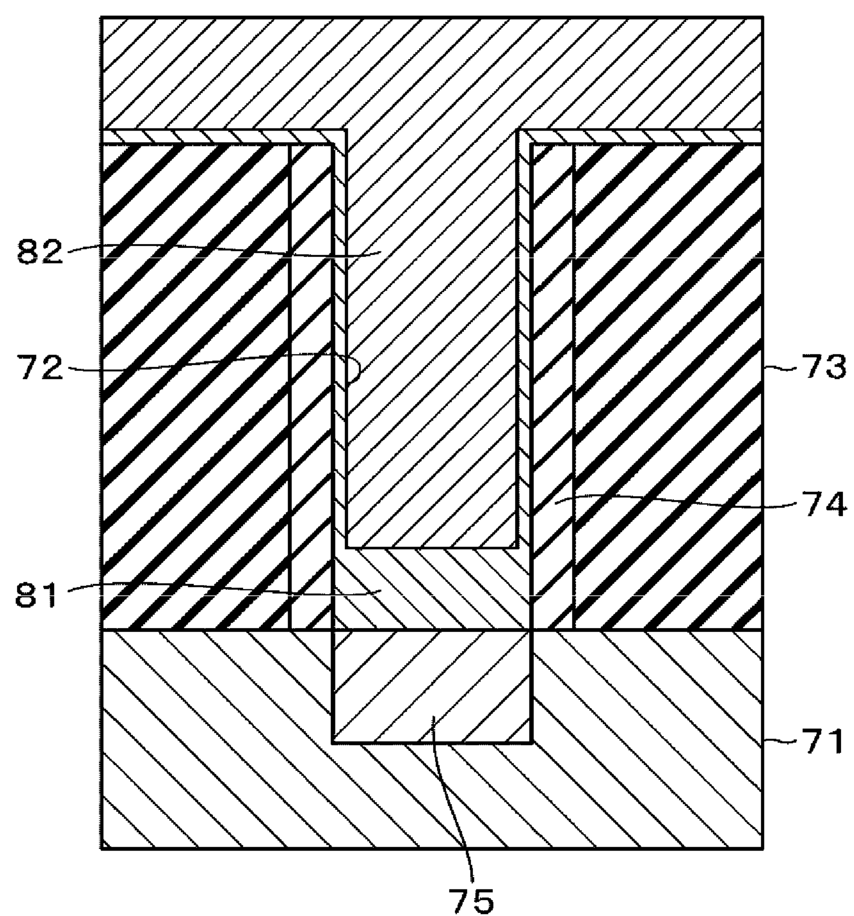
FIG. 4C is a third longitudinal cross-sectional view of the wafer surface.

In addition, the inventors are aware that the Ru film is hardly deposited on an exposed surface of the SiO film 73. Therefore, if the SiN layer 74 covering the SiO film 73 is not formed on the sidewall portion 721 of the recess 72, the above-described method results in little or no formation of the first Ru film 81 on the sidewall portion 721 even if film formation is performed. Here, FIGS. 4B and 4C illustrate an example where the Ru film is deposited on a top surface of the SiO film 73, but there are cases where the Ru film is deposited on the top surface of the SiO film 73 depending on film formation conditions.

The first Ru film 81 is formed using a gas containing a ruthenium compound that does not contain oxygen and carbon atoms, as a ruthenium precursor. Therefore, the first Ru film 81 does not contain oxygen atoms originating from a precursor, and there is less risk that the metal layer exposed at the bottom surface 722 of the recess 72 is oxidized. Further, there is less likelihood of residual carbon atoms originating from a precursor inside the first Ru film 81. In contrast, if the ruthenium precursor is a ruthenium compound containing oxygen and carbon atoms, there is a higher risk that the formed Ru film will contain oxygen and carbon atoms. This may lead to the oxidation of the metal layer by oxygen atoms, resulting in the formation of a metal oxide and an increase in resistivity. Further, if the Ru film contains carbon atoms, it may contribute to an increase in resistivity and deterioration in film quality.

As such, by using a ruthenium precursor that does not contain oxygen and carbon atoms to form the first Ru film 81, an increase in resistivity at an interface with the TiSi layer 75 (contact layer), which is a metal layer exposed at the bottom surface 722 of the recess 72, is prevented, and deterioration in film quality related to the conductivity of the first Ru film 81 is prevented.

<Embedding of Ruthenium (Formation of Second Ru Film)>

Subsequently, the second transfer mechanism 141 transfers the wafer 10, on which the first Ru film 81 has been formed, to the second film formation processor 2B. The second film formation processor 2B performs a process of embedding ruthenium in the recess 72 to cover the ruthenium layer (first Ru film 81) formed inside the recess 72.

Specifically, the wafer 10 is loaded into the second processing container 22 and is mounted on the susceptor 3. The wafer 10 is then heated to a temperature lower than the film formation temperature of the first Ru film 81, for example, within a range of 120 degrees C. to 300 degrees C. Further, the internal pressure of the second processing container 22 is regulated to, for example, 1.3 Pa. At this time, $Ru_3(CO)_{12}$ is heated by the heater 62 in the precursor container 61. A CO gas serving as a carrier gas is supplied to this precursor container 61, causing $Ru_3(CO)_{12}$ vaporized by heating to be picked up and supplied to the second processing container 22, as a ruthenium precursor. Furthermore, a CO gas for reaction adjustment is supplied to the second processing container 22.

This results in the vaporized $Ru_3(CO)_{12}$ being supplied to the wafer 10. Then, thermal CVD proceeds on the wafer 10 to thermally decompose $Ru_3(CO)_{12}$. The second Ru film 82 is formed on the SiO film 73 to have a preset thickness. During this film formation, the second Ru film 82 is formed to be embedded in the recess 72, as illustrated in FIG. 4C. In addition, the CO gas for reaction adjustment is supplied to prevent excessive progress of thermal decomposition. As such, the second Ru film 82 is formed to cover the first Ru film 81, thereby being embedded inside the recess 72.

Here, as previously described above, the first Ru film 81 is formed not only on the bottom surface 722 but also on the sidewall portion 721 inside the recess 72. The first Ru film 81 functions as a liner film that is an adhesion layer for the second Ru film 82. Therefore, the deposition of the second Ru film 82 similarly proceeds on the sidewall portion 721 and bottom surface 722 side of the recess 72, which facilitate rapid embedding of ruthenium into the recess 72.

The ruthenium precursor for the second Ru film 82 such as $Ru_3(CO)_{12}$ contains oxygen and carbon atoms, but has no risk of oxidizing the TiSi layer 75 on the bottom surface 722 of the recess 72 when the second Ru film 82 is formed as a bulk film on top of the first Ru film 81. Further, the inventors are aware that the upper limit of the resistivity of the bulk film formed using $Ru_3(CO)_{12}$ is approximately 20 $\mu\Omega\cdot cm$ and the upper limit of the resistivity of the bulk film formed using $Ru(PF_3)_4H_2$ is approximately 100 $\mu\Omega\cdot cm$. Thus, in a region where there is no concern about the oxidation of the TiSi layer 75, using $Ru_3(CO)_{12}$ to form the second Ru film 82 may reduce the overall resistivity of ruthenium embedded in the recess 72.

After the film formation process is completed, the wafer 10 is transferred to the load lock chamber 12 via the second transfer mechanism 141, the delivery sections 17, and the first transfer mechanism 131. Next, after the atmosphere in the load lock chamber 12 is switched to the atmospheric pressure atmosphere, the processed wafer 10 is returned to the carrier C by the atmospheric transfer mechanism 111.

Thereafter, the wafer 10 is transferred to a chemical mechanical polishing (CMP) apparatus provided outside the film forming apparatus 1 so that the surface of the wafer 10 is polished to remove the second Ru film 82 on the top surface of the recess 72 and an upper portion of the SiO film 73 constituting the recess 72. Accordingly, the depth of the recess 72 after CMP becomes smaller than the above-described dimension.

According to the above-described embodiment, it is possible to implement the embedding of ruthenium while preventing an increase in resistivity for the recess 72 formed on the wafer surface.

To embed ruthenium into the deep recess 72 with a high aspect ratio, it is necessary for a bulk film serving as the embedding material to have low resistivity and to reduce the resistivity at the interface with the exposed metal layer (TiSi layer 75 in this example) on the bottom surface 722 of the recess 72. As previously described above, the Ru film formed using $Ru_3(CO)_{12}$ as a bulk film has low resistivity but contains oxygen atoms. Thus, embedding $Ru_3(CO)_{12}$ in the recess 72 may lead to the formation of an oxide film at the interface with the metal layer, causing concerns about an increase in resistivity at that interface. On the other hand, since the Ru film formed using $Ru(PF_3)_4H_2$ does not contain oxygen atoms, an increase in resistivity at the interface is prevented, while the resistivity as a bulk film is higher than in the Ru film formed using $Ru_3(CO)_{12}$ as previously described above.

Therefore, two types of ruthenium precursors are combined, and the precursor of the first Ru film 81 formed at the interface with the bottom surface 722 of the recess 72 and the precursor of the second Ru film 82 as a bulk film are switched. Thus, the resistivity at the interface of the exposed metal on the bottom surface of the recess 72 may be lowered and a material with low resistivity may be selected as a bulk film, which enables the embedding of low-resistance ruthenium in the recess. As a result, it is possible to realize metal wiring with low resistivity.

Further, when the sidewall portion 721 of the recess 72 is composed of the SiN layer 74, the first Ru film 81 also functions as a liner film as previously described above. Therefore, the second Ru film 82 is rapidly formed in the recess 72, and the film formation time of the second Ru film 82 is shortened, compared to a case where the first Ru film 81 is not formed on the sidewall portion 721 of the recess 72.

As such, when the sidewall portion 721 of the recess 72 is composed of the SiN layer 74, there is no need to form a separate liner film, and the ruthenium embedded in the recess 72 includes two layers of the first Ru film 81 and the second Ru film 82. Thus, since it is not necessary to form a separate liner film, there is no concern about an increase in the total effort or time for the process of embedding ruthenium in the recess 72 even when both films are formed by switching the ruthenium precursor gases.

Further, in the above-described film forming apparatus 1, the removal of the native oxide film in the recess 72, the formation of the TiSi layer, the formation of the first Ru film 81, and the formation of the second Ru film 82 are all performed inside the same film forming apparatus 1. Since the processors for performing these processes are connected to the substrate transfer chamber in a vacuum pressure atmosphere, there is less risk of the native oxide film being formed in the recess due to contact between the wafer and the atmosphere during the transfer of the wafer between the processors. This allows for the rapid formation of low resistivity ruthenium in the recess 72 after the removal of the native oxide film.

Second Embodiment

Figure 5A:
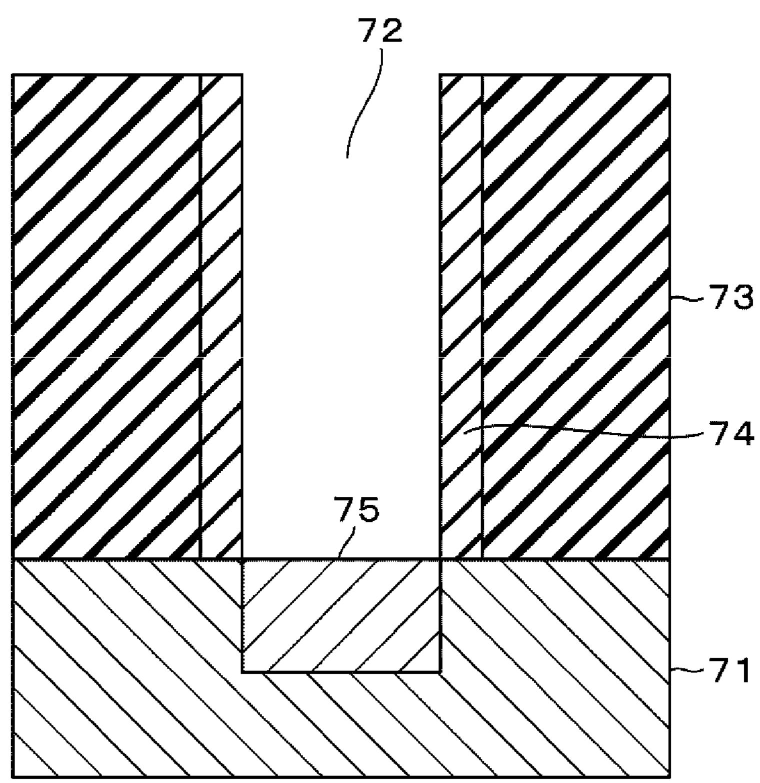
FIG. 5A is a first longitudinal cross-sectional view of the wafer surface related to a second embodiment step of the above method.

Next, a second embodiment of the present disclosure will be described with reference to FIGS. 5A to 5C. The second embodiment differs from the first embodiment in the film formation conditions of the first Ru film. Thus, the procedure up to the formation of the TiSi layer 75 exposed on the bottom surface of the recess 72 as illustrated in FIG. 5A is the same as in the first embodiment.

In this embodiment as well, the wafer 10 is transferred to the first processing container 21 of the first film formation processor 4A, and a gas containing a ruthenium precursor such as $Ru(PF_3)_4H_2$ and a reducing gas such as a $H_2$ gas are supplied to form a first Ru film (ruthenium layer) 83 on the wafer by CVD.

In the second embodiment, a ruthenium film (first Ru film 83) is formed such that the thickness of the ruthenium film is uniform both on the sidewall portion 721 of the recess 72 covered with the SiN layer 74 and on the bottom surface 722 of the recess 72 where the TiSi layer 75 is exposed.

Figure 5B:
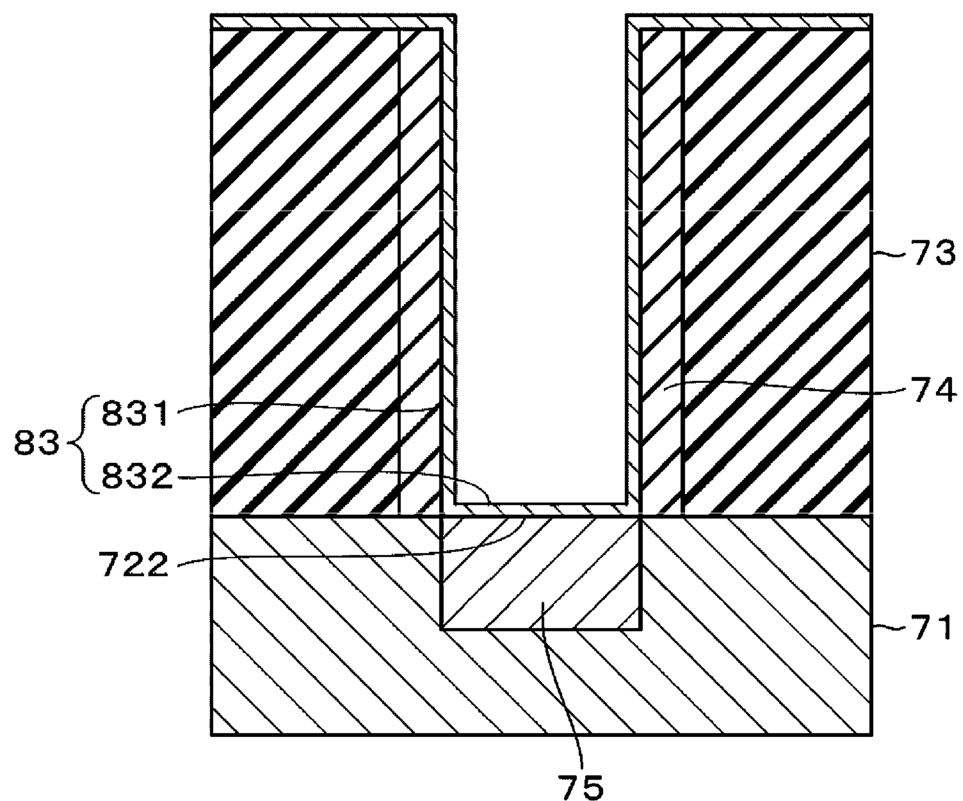
FIG. 5B is a second longitudinal cross-sectional view of the wafer surface.
Figure 5C:
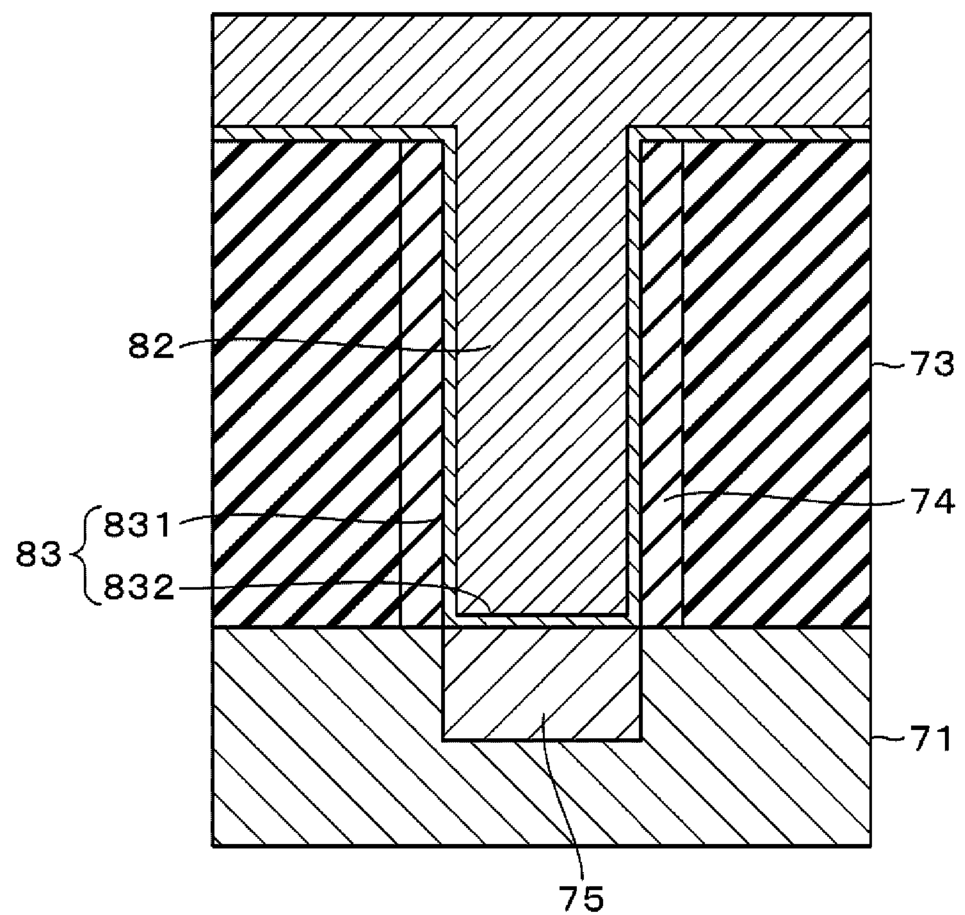
FIG. 5C is a third longitudinal cross-sectional view of the wafer surface.

In other words, in this embodiment, as illustrated in FIG. 5B, a substantially uniform thickness of the first Ru film 83 is formed, which includes a Ru layer 831 on the sidewall portion 721 side and a Ru layer 832 on the bottom portion. The thickness of the first Ru film 83 formed in this example is within a range of 0.5 nm to 5 nm, and is, for example, 1 nm.

Similarly to the film formation method in which the film thickness is greater on the bottom portion than on the sidewall portion 721 as described with reference to FIG. 4B, the film formation of the first Ru film 83 in this embodiment may also be implemented by adjusting factors such as the heating temperature of the wafer 10, the internal pressure of the processing container 21, and the supply ratio between the ruthenium precursor and the reducing gas.

In addition, in the film formation using $Ru_3(CO)_{12}$ as a precursor, it is possible to form Ru films with different thicknesses, similarly to the example illustrated in FIG. 4B, by lowering the film formation pressure and reducing the CO supply ratio. On the other hand, the inventors are aware that increasing the film formation pressure may result in the formation of a Ru film having a uniform thickness, similarly to the example illustrated in FIG. 5B.

The bottom portion of the recess 72 is a region where the first Ru film 83 is formed on the bottom surface 722 of the recess 72. If the thickness of the first Ru film 83 is too small, oxygen atoms contained in the second Ru film 82 formed on top of the first Ru film 83 may diffuse to the TiSi layer 75, causing concerns about an increase in resistivity. Further, if the thickness of the first Ru film 83 is too large, the region occupied by the second Ru film 82 becomes small, causing concerns about an increase in resistivity.

Therefore, the thickness of the first Ru film 83 may be thicker than 1 nm.

Further, “uniform thickness” refers to a ratio between a thickness T1 of the Ru layer 831 on the sidewall portion 721 of the recess 72 and a thickness T2 of the Ru layer 832 on the bottom portion of the recess 72 that is within a range of 0.8 to 1.2.

After forming the first Ru film 83 in this way, the wafer 10 is transferred to the second film formation processor 2B. Then, in the second processing container 22, a process of embedding the second Ru film 82 into the recess 72 is performed so that the second Ru film 82 covers the first Ru film 83 by the same method as in the first embodiment. As such, in the next step, the wafer 10 with ruthenium embedded in the recess 72 is subjected to CMP, similarly to the first embodiment.

In this embodiment as well, the first Ru film 83, which originates from a precursor that does not contain oxygen and carbon atoms, is formed at the interface between the TiSi layer 75 and the bottom surface 722 of the recess 72. Then, the second Ru film 83 is formed as a bulk film using $Ru_3(CO)_{12}$ to cover this first Ru film 83. Therefore, ruthenium may be embedded in the recess 72 while preventing an increase in resistance.

Further, in this embodiment, the first Ru film 83 is formed to have a substantially uniform thickness on the sidewall portion 721 and the bottom surface 722 of the recess 72, and serves as a liner film. Therefore, the step of separately forming a liner film between the first Ru film 83 and the second Ru film 82 may be omitted.

<Evaluation Test>

Subsequently, an evaluation test of a ruthenium layer using a ruthenium precursor such as $Ru(PF_3)_4H_2$ will be described with reference to FIG. 6. The ruthenium layer was formed within the range of the film formation conditions described in the first embodiment by changing the film formation temperature and the types of reaction gases ($H_2$ gas and $NH_3$ gas), and the film formation rate at this time was measured. In addition, the internal pressure of the processing container during film formation was set to 933 Pa. This result is illustrated in FIG. 6.

Figure 6:
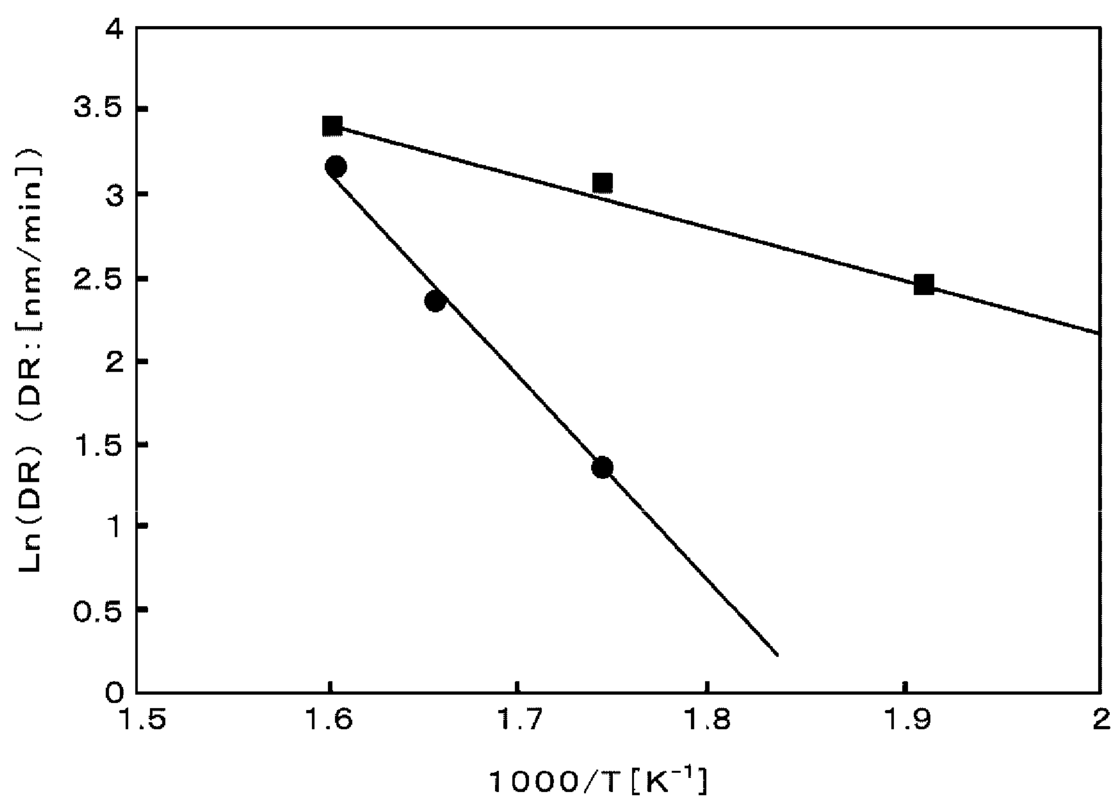
FIG. 6 is a characteristic diagram illustrating a relationship between a film formation temperature and a film formation rate in forming a ruthenium layer.

In FIG. 6, the horizontal axis represents a reciprocal of the absolute temperature (T) multiplied by 1,000, with the smaller value indicating the higher film formation temperature. The numerical values on the horizontal axis, such as “1.6”, correspond to the temperatures of 352 degrees C., “1.7” to 315 degrees C., “1.8” to 283 degrees C., and “1.9” to 253 degrees C. Further, the vertical axis represents the natural logarithm of the film formation rate DR (nm/mm). Data for using a $H_2$ gas as the reaction gas are plotted with filled black circles (●), while data for using a $NH_3$ gas are plotted with filled black squares (■).

According to the result of the film formation experiment, it was observed that a gas containing $Ru(PF_3)_4H_2$ could form a ruthenium layer by CVD using either a $H_2$ gas or $NH_3$ gas as the reaction gas. Further, it was confirmed that the film formation rate varies by varying the film formation temperature, and that the film formation rate increases with higher film formation temperature in cases of any reaction gas. Furthermore, it was confirmed that the film formation rate varies depending on the type of reaction gas even at the same film formation temperature, and that the rate of change in film formation rate is different depending on a change in film formation temperature. Accordingly, it is understood that the optimal range of the film formation temperature may vary depending on the type of reaction gas even with the same ruthenium precursor.

In each embodiment described above, the second gas supplier may be configured to supply a gas containing $Ru_3(CO)_{12}$ to the processing container, and it is not essential to supply a CO gas for reaction adjustment.

Further, the ruthenium precursor for forming the ruthenium layer may be any ruthenium compound that does not contain oxygen and carbon atoms, and is not limited to $Ru(PF_3)_4H_2$. Furthermore, the method for forming the ruthenium layer may be not only CVD but also atomic layer deposition (ALD), where a precursor gas and a reaction gas are alternately supplied. Further, when performing CVD or ALD, a plasma may be used for activating the precursor gas or the reaction gas.

Further, as illustrated in FIG. 1, it is not an essential requirement to form the first Ru films 81 and 83, and the second Ru film 82 in different processing containers 21 and 22 of the first and second film formation processors 2A and 2B. For example, the film forming apparatus may be configured to perform the formation of a ruthenium layer (first Ru film 81 or 83) and the embedding of ruthenium (second Ru film 82) in a common processing container. In this case, the processing container is configured to include a first gas supplier that supplies a gas containing a ruthenium compound that does not contain oxygen and carbon atoms and a second gas supplier that supplies a gas containing $Ru_3(CO)_{12}$. Then, the first gas supplier supplies the gas containing the ruthenium compound to form a ruthenium layer on a region of the wafer 10 including the bottom portion of the recess 72. Next, the gas supply is switched from the first gas supplier to the second gas supplier, such that a gas containing $Ru_3(CO)_{12}$ is supplied to the wafer 10 to embed ruthenium into the recess 72 so as to cover the ruthenium layer.

In the film forming apparatus 1 illustrated in FIG. 1, the delivery section 17 is used to connect two substrate transfer chambers 13 and 14, but this is done to suppress enlarging the substrate transfer chamber when the number of modules connected to one substrate transfer chamber increases. Thus, if the enlargement of the substrate transfer chamber is suppressed, the preprocessor 15 and the Ru film former 2 may be connected to a common substrate transfer chamber. Further, contrary to this, the film forming apparatus 1 may be configured to include three or more substrate transfer chambers.

The embodiments disclosed herein should be considered to be exemplary and not limitative in all respects. The above embodiments may be omitted, replaced or modified in various embodiments without departing from the scope of the appended claims and their gist.

EXPLANATION OF REFERENCE NUMERALS

10: semiconductor wafer, 72: recess, 81, 83: first ruthenium film (ruthenium layer), 82: second ruthenium film (embedded ruthenium film)

What is claimed is:

1. A method for embedding ruthenium in a recess formed on a surface of a substrate, the method comprising:

forming a ruthenium layer in a region including a bottom portion of the recess by supplying a first gas including, as a first ruthenium precursor, a ruthenium compound that does not contain oxygen and carbon atoms to the substrate having a metal exposed on a bottom surface of the recess; and subsequently embedding ruthenium in the recess so as to cover the ruthenium layer by supplying a second gas including, as a second ruthenium precursor, $Ru_3(CO)_{12}$ to the substrate.

2. The method of claim 1, wherein the ruthenium compound is $Ru(PF_3)_4H_2$.

3. The method of claim 2, wherein the second gas including $Ru_3(CO)_{12}$ further includes a CO gas.

4. The method of claim 3, wherein in the forming the ruthenium layer, the ruthenium layer is formed such that the ruthenium layer formed on the bottom portion of the recess is thicker than the ruthenium layer formed along a sidewall portion of the recess.

5. The method of claim 4, wherein the recess is formed in a silicon oxide film on the surface of the substrate, and wherein the metal exposed on the bottom surface of the recess includes titanium and silicon.

6. The method of claim 5, wherein a silicon nitride layer covering the silicon oxide film is formed on the sidewall portion of the recess.

7. The method of claim 3, wherein in the forming the ruthenium layer, the ruthenium layer is formed to have a uniform thickness between the ruthenium layer formed on a sidewall portion of the recess and the ruthenium layer formed on the bottom portion of the recess.

8. The method of claim 7, wherein the recess is formed in a silicon oxide film on the surface of the substrate, and wherein the metal exposed on the bottom surface of the recess includes titanium and silicon.

9. The method of claim 8, wherein a silicon nitride layer covering the silicon oxide film is formed on the sidewall portion of the recess.

10. The method of claim 1, wherein the second gas including $Ru_3(CO)_{12}$ further includes a CO gas.

11. The method of claim 1, wherein in the forming the ruthenium layer, the ruthenium layer is formed such that the ruthenium layer formed on the bottom portion of the recess is thicker than the ruthenium layer formed along a sidewall portion of the recess.

12. The method of claim 1, wherein in the forming the ruthenium layer, the ruthenium layer is formed to have a uniform thickness between the ruthenium layer formed on a sidewall portion of the recess and the ruthenium layer formed on the bottom portion of the recess.

13. An apparatus for embedding ruthenium in a recess formed on a surface of a substrate, the apparatus comprising:

a processing container configured to accommodate the substrate having a metal exposed on a bottom surface of the recess;

a first gas supplier configured to supply a first gas including, as a first ruthenium precursor, a ruthenium compound that does not contain oxygen and carbon atoms to the processing container;

a second gas supplier configured to supply a second gas including, as a second ruthenium precursor, $Ru_3(CO)_{12}$ to the processing container; and a controller, wherein the controller is configured to output control signals for executing: a step of forming a ruthenium layer in a region including a bottom portion of the recess by supplying the first gas including the ruthenium compound from the first gas supplier to the substrate inside the processing container; and a step of subsequently embedding ruthenium in the recess so as to cover the ruthenium layer by supplying the second gas including $Ru_3(CO)_{12}$ from the second gas supplier to the substrate.

14. The apparatus of claim 13, wherein the processing container includes a first processing container provided with the first gas supplier and a second processing container provided with the second gas supplier, the first processing container and the second processing container being configured as separate bodies, wherein the first processing container and the second processing container are connected to a common substrate transfer chamber including a transfer mechanism for the substrate, and wherein the controller is further configured to output control signals for executing: the step of forming the ruthenium layer in the first processing container, and then a step of transferring the substrate having the ruthenium layer formed on the substrate to the second processing container and embedding the ruthenium in the second processing container.

15. The apparatus of claim 13, wherein the first gas supplier is configured to supply, as the ruthenium compound, $Ru(PF_3)_4H_2$.

16. The apparatus of claim 13, wherein the second gas supplier is further configured to supply a gas including $Ru_3(CO)_{12}$ and a CO gas.

17. The apparatus of claim 13, wherein in the forming the ruthenium layer, the ruthenium layer is formed such that the ruthenium layer formed on the bottom portion of the recess is thicker than the ruthenium layer formed along a sidewall portion of the recess.

18. The apparatus of claim 13, wherein in the forming the ruthenium layer, the ruthenium layer is formed to have a uniform thickness between the ruthenium layer formed on a sidewall portion of the recess and the ruthenium layer formed on the bottom portion of the recess.

19. The apparatus of claim 13, wherein the recess is formed in a silicon oxide film on the surface of the substrate, and wherein the metal exposed on the bottom surface of the recess includes titanium and silicon.

20. The apparatus of claim 19, wherein a silicon nitride layer covering the silicon oxide film is formed on a sidewall portion of the recess.

* * * * *